United States Patent [19]
Terasawa et al.

[11] 4,124,802
[45] Nov. 7, 1978

[54] METHOD AND APPARATUS FOR IMPLANTING RADIOACTIVE GAS IN A BASE MATERIAL

[75] Inventors: Mititaka Terasawa, Yokohama; Katsuhiko Mawatari; Osamu Morimiya, both of Tokyo, all of Japan

[73] Assignee: Tokyo Shibaura Electric Co., Ltd., Tokyo, Japan

[21] Appl. No.: 699,655

[22] Filed: Jun. 24, 1976

[30] Foreign Application Priority Data
Jun. 24, 1975 [JP] Japan .................................. 50-78016

[51] Int. Cl.² ........................................... H01J 37/28
[52] U.S. Cl. ............................ 250/492 A; 250/423 R
[58] Field of Search ............... 250/423, 424, 425, 398, 250/492 A, 492 B

[56] References Cited
U.S. PATENT DOCUMENTS

| 2,682,611 | 6/1954 | Woodward et al. | 250/425 |
| 3,434,894 | 3/1969 | Gale | 250/492 A |
| 3,569,757 | 3/1971 | Brewer et al. | 250/492 A |
| 3,585,397 | 6/1971 | Brewer | 250/492 A |
| 3,699,334 | 10/1972 | Cohen et al. | 250/492 A |
| 3,786,359 | 1/1974 | King | 250/423 |

Primary Examiner—Alfred E. Smith
Assistant Examiner—B. Anderson
Attorney, Agent, or Firm—Finnegan, Henderson, Farabow & Garrett

[57] ABSTRACT

A method and apparatus for implanting radioactive gas in a base material which comprises the steps of conducting radioactive gas received in a reservoir to an ion source for ionization; accelerating said ionized radioactive gas into a high energy form; and implanting said high energy radioactive ion beam in a foil made of, for example, stainless steel, aluminium or copper and received in an ion implantation unit.

17 Claims, 21 Drawing Figures

METHOD AND APPARATUS FOR IMPLANTING RADIOACTIVE GAS IN A BASE MATERIAL

BACKGROUND OF THE INVENTION

This invention relates to a method and apparatus for disposing of radioactive gas and more particularly to a method and apparatus characterized by implanting ionized and accelerated radioactive gas in a base material.

To date, radioactive Kr-85 gas evolved from a nuclear fuel-reprocessing plant has been disposed of by being sealed in a pressure vessel like a cylinder. However, this procedure has the drawbacks that where the Kr-85 radioactive gas is stored for long in a pressure vessel, said vessel is gradually subject to general corrosion, giving rise to minute cracks under stress with the resultant possible leakage of said Kr-85 radioactive gas; the pressure vessel has to be periodically tested for pressure resistance in order to avoid the abovementioned danger; and this test has to be carried by transferring the radioactive Kr-85 gas from the currently used pressure vessel to another pressure vessel each time, thus involving a complicated and risky work.

SUMMARY OF THE INVENTION

It is accordingly the object of this invention to provide a method and apparatus capable of safely detaining radioactive gas over a long period, instead of storing said radioactive gas in the original form as has been practised in the past.

To this end, the method of this invention comprises the steps of ionizing radioactive gas, accelerating the ionized radioactive gas into a high energy form and implanting the high energy radioactive gas in a base material for permanent detainment. To attain the above-mentioned object, the apparatus of this invention is provided with a radioactive gas reservoir; an ion source for ionizing the radioactive gas delivered from the reservoir; an accelerator for accelerating the ions produced in the ion source; and an ion implantation unit connected to the accelerator through the extension thereof and designed to implant high energy ion beams conducted through the accelerator for detainment in a base material received in said ion implantation unit.

With a preferred embodiment of this invention, first and second exhaust units are connected to the extension of the accelerator and ion implantation unit respectively, enabling residual gas to be drawn off from the accelerator extension by the first exhaust unit and also radioactive gas released from the base material to be taken out by the second exhaust unit. This arrangement allows high energy ion beams sent forth from the accelerator to be smoothly implanted in the base material without being scattered by residual gas and the gas released from the base material in the ion implantation unit and a passage thereto.

The base material is formed of, for example, a band-shaped stainless steel foil. The foil is made to travel relative to the high energy ion beams by driving means, thereby enabling a large amount of radioactive gas to be detained in the base material. This base material may be prepared from not only a stainless steel foil, but also other foils of metals such as aluminium and copper.

An electromagnetic deflection unit is provided in an intermediate unit following the aforesaid accelerator extension to create an A.C. magnetic field or A.C. electric field acting perpendicular to the running course of the ionized beam. The ion beam is oscillated in zigzags across the metal foil, causing the ion beam to be fully implanted in said foil even when the foil is made to travel slowly.

Where a radioactive gas is mixed with nonradioactive gases having a different mass number, all the gases are ionized into ion beams, and a separation magnet is provided in a passage of said mixed ion beams to separate the radioactive component from the ion beam, enabling a large amount of the radioactive ion beam alone to be securely implanted in the metal foil. In this case, a stopper made of heat-resistant material such as graphite, pyrocarbon, magnesia, calcia or zirconia is placed in an intermediate stopper chamber formed in the intermediate unit following the ion separation magnet or in the ion implantation unit. The nonradioactive ion beams are ejected on the stopper to be partly implanted therein. The remainder of said nonradioactive ion beams is again released for gasification. The gasified nonradioactive ion beam is drawn off by an exhaust unit connected to the intermediate stopper chamber and ion implantation unit. Therefore, the radioactive ion beam can be smoothly implanted in the metal foil without being scattered during passage by the above-mentioned released nonradioactive gas.

This invention which securely detains radioactive gas in a proper base material instead of storing it in the original form eliminates the necessity of providing a pressure vessel as has been practised in the past. Therefore, this invention has the advantages that the previously described drawbacks accompanying the pressure vessel are avoided; and the base material is kept in storage under such a condition as prevents the escape of radioactive gas, thereby attaining the permanent safekeeping of radioactive gas.

DETAILED DESCRIPTION OF THE PREFERRED EMBODIMENT

Figure 1:
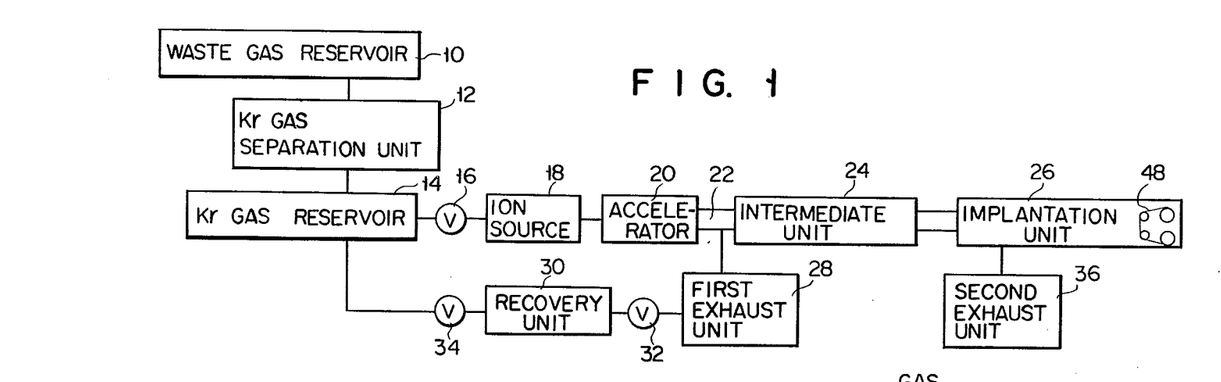
FIG. 1 is a block diagram of a radioactive gas-implanting apparatus embodying this invention.

FIG. 1 shows the arrangement of a radio active gas-implanting apparatus embodying this invention. This embodiment represents the apparatus which implants a radioactive krypton gas Kr-85 released from, for example, the waste gas reservoir of a nuclear fuel-reprocessing plant together with any other nonradioactive krypton gas Kr in a metal foil used as a base material. All krypton gases evolved from the waste gas reservoir 10 are separated from other gases by a krypton gas separation unit 12 and conducted to a krypton gas reservoir 14, and then to an ion source 18 through a valve 16. When the krypton gas is ionized in the ion source 18, a highly ionized plasma of the krypton gas is produced. The ionized krypton or $Kr^+$ ion is extracted from said plasma by high voltage supplied on an accelerator 20 and, after accelerated, is conducted to an ion implantation unit 26 through an accelerator extension 22 and intermediate unit 24, to be implanted in a metal foil 48 (FIG. 2) made of, for example, aluminium, copper or stainless steel received in the ion implantation unit 26 (said foil is hereinafter represented by that of stainless steel). The intermediate unit 24 has various constructions according to the manner in which the $Kr^+$ ion is implanted in the stainless steel foil 48.

A first exhaust unit 28 connected to the accelerator extension 22 draws off gases remaining in the accelerator 20, extension 22 thereof and intermediate unit 24 to prevent the $Kr^+$ ion beam from striking against the molecules of said other gases with the resultant scattering, energy loss or charge exchange. Therefore, the first exhaust unit 28 should have a large capacity. The other gases thus discharged and still containing radioactive krypton gas Kr-85 which was not ionized in the ion source 18 are returned to the krypton gas reservoir 14, or to the waste gas reservoir 10 if necessary, through a recovery unit 30, and valves 32, 34. The ion implantation unit 26 is connected to a second exhaust unit 36 which draws off krypton gas released from the stainless steel foil 48.

Figure 2:
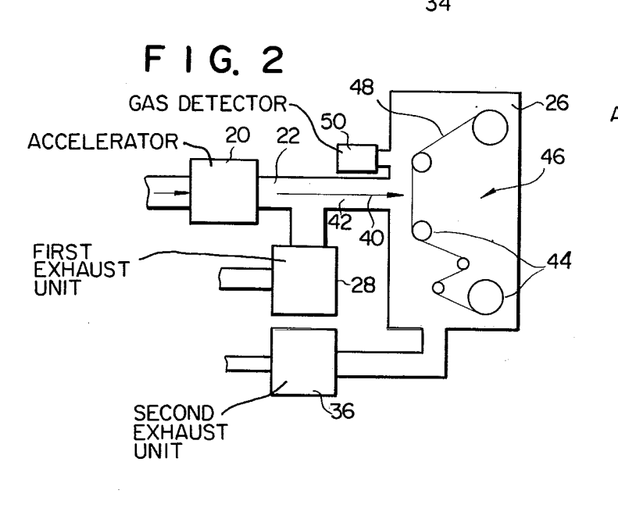
FIG. 2 illustrates the first embodiment of the intermediate unit and ion implantation unit of FIG. 1.

FIG. 2 shows the arrangement by which all the $Kr^+$ ion beams 40 sent forth from the accelerator 20 are immediately introduced into the ion implantation chamber 26 through the accelerator extension 22 and the following beam tube 42. The beam tube 42 acts as a sort of the intermediate unit 24 of FIG. 1. The $Kr^+$ ion beams 40 are implanted in the stainless steel foil 48 traveling about a foil-driving device 46 provided with many rollers 44. The stainless steel foil 48 may be so constructed as to admit of a reciprocating movement or an endless run.

The $Kr^+$ ion beam 40 implanted in the stainless steel foil 48 is stored therein in the form of bubbles of gaseous atoms. Since however an amount of said $Kr^+$ ion beam 40 implanted per unit area of the stainless steel foil 48 is subject to an upper limit, said foil 48 has to be run quickly relative to the $Kr^+$ ion beam 40 in order to implant a large amount of said $Kr^+$ ion beam 40 in total. The stainless steel foil 48 may have a broader width than the $Kr^+$ ion beam 40.

If the traveling position of the stainless steel foil 48 is shifted, then implantation of the $Kr^+$ ion beam can be effected over the entire surface of said foil 48. When the $Kr^+$ ion beam has been implanted, the stainless steel foil 48 is taken up on a proper reel and carefully kept in storage.

A gas detector 50 fitted to the ion implantation unit 26 determines the concentration of the Kr gas in said implantation unit 26 and instructs the amount of the $Kr^+$ ion beam being implanted in the stainless steel foil 48, thereby controlling the amount of said implantation according to the instructed value. An output signal from the gas detector 50 may be used for automatic control of the ion-implanting process.

Where all the $Kr^+$ ion beams are implanted in the stainless foil 48 with the implanting process properly controlled, then an amount of the Kr gas released from the ion implanted foil 48 is more decreased than in the later described case where only the separated radioactive $Kr^+-85$ ion is implanted in the stainless steel foil 48 and the remaining nonradioactive krypton ion beams are made to strike against the stoppers 74, 82 (FIGS. 6 and 7) placed in the ion implantation unit 26. Therefore, it is possible to use a vacuum pump of relatively small capacity as the second exhaust unit 36.

Figure 3:
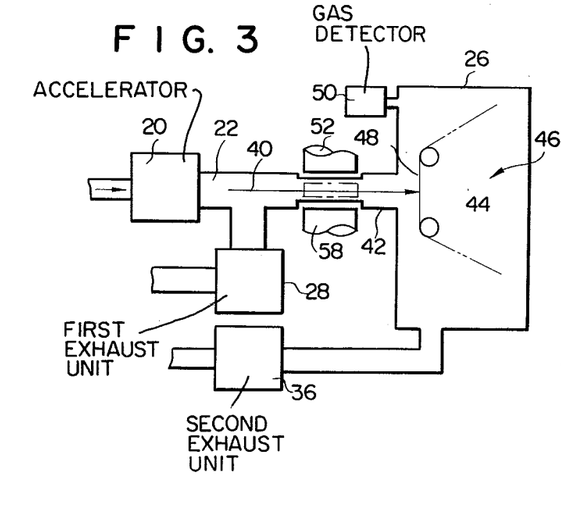
FIG. 3 shows the second embodiment of the intermediate unit of FIG. 1 which is provided with an electric or magnetic deflection unit.
Figure 4:
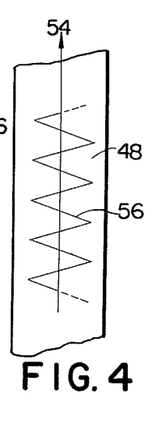
FIG. 4 indicates the manner in which the ion beam is oscillated by the action of the deflection unit of FIG. 3.

FIG. 3 shows the second embodiment of the intermediate unit or beam tube 42, wherein an A.C. magnetic field acting perpendicular to the $Kr^+$ ion beam 40 is created outside of said beam tube 42, and a magnetic deflection unit 52 is provided which causes the $Kr^+$ ion beam 40 to oscillate in zigzags in a direction perpendicular to the surface of the drawing. If the stainless steel foil 48 is made to run in the direction of an arrow 54 indicated in FIG. 4, then the $Kr^+$ ion beam 40 is implanted in the stainless steel foil 48 while traveling through a zigzag route 56. Therefore, the stainless steel foil 48 can be made to run more slowly.

Where the magnetic deflection unit 52 is replaced by an electrode 58 (indicated in an imaginary line in FIG. 3) provided on both sides of the beam tube 42 so as to extend perpendicular to the drawing surface and an A.C. electric field is applied to the $Kr^+$ ion beam 40, then said beam 40 can be oscillated in zigzags as in the case of the magnetic deflection unit 52.

Figure 5:
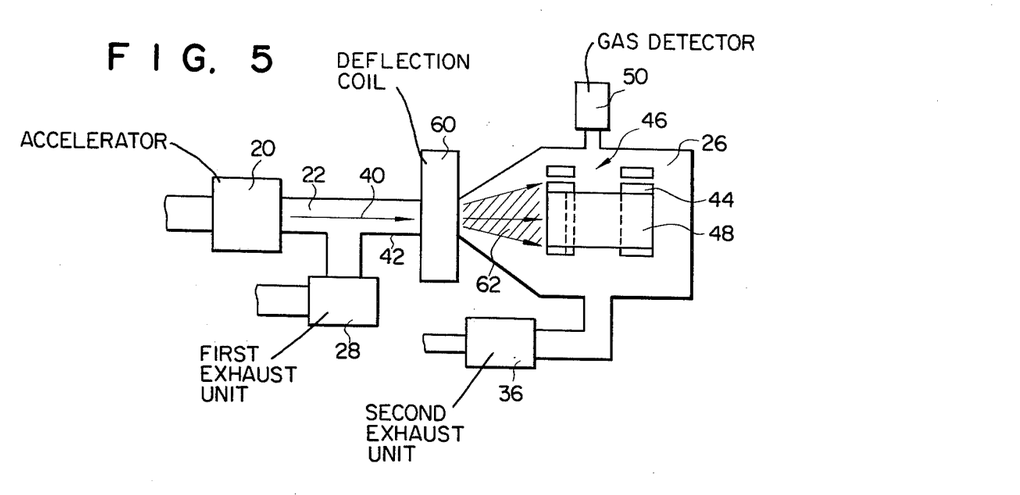
FIG. 5 presents the third embodiment of the intermediate unit of FIG. 1 which is provided with a magnetic deflection coil.

FIG. 5 shows the third embodiment of the intermediate unit, wherein a deflection coil 60 is provided outside of the beam tube 42 used as the intermediate unit, and the $Kr^+$ ion beam passing through said deflection coil 60 is expanded to cover the full width of the stainless steel foil 48 as indicated in a hatching 62. Accordingly, the Kr+ ion beam is implanted over the entire surface of the stainless steel foil 48, enabling it to run more slowly.

The radioactive component Kr+ −85 of the krypton ion beams 40 accelerated by the accelerator 20 accounts for substantially 7% of the whole mass under the condition in which a nuclear fuel is continuously burnt for three years, followed by cooling of 180 days. About 93% as the remainder is constituted by nonradioactive krypton ions mainly formed of Kr+ −82, Kr+ −83, Kr+ −84 and Kr+ −86. If, therefore, the harmful radioactive krypton ion Kr+ −85 could be separated from the whole Kr+ ion mass to be implanted in the stainless steel foil 48 for permanent detainment, then great convenience would be offered. This separation is attained by fitting a plurality of ion separation magnets 64 (FIGS. 6, 7) to the intermediate unit 24 of FIG. 1.

Figure 6:
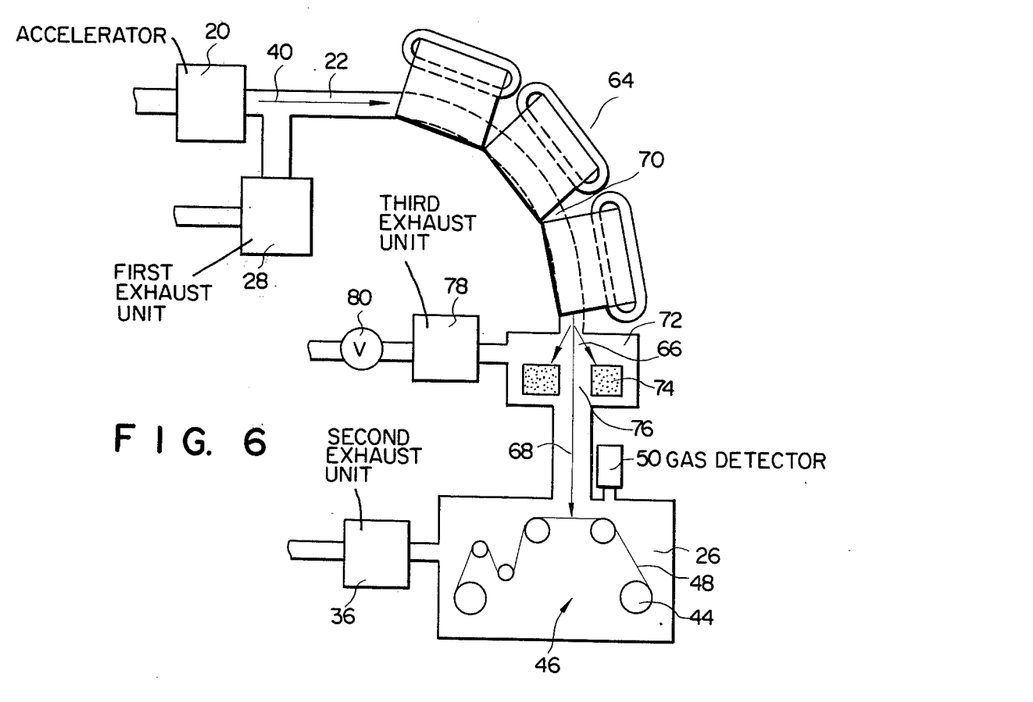
FIG. 6 sets forth the fourth embodiment of the intermediate unit of FIG. 1 which is provided with an ion separation magnet, intermediate stopper chamber and a third exhaust unit.

FIG. 6 shows an embodiment of the intermediate unit 24 of FIG. 1 which are provided with ion separation magnets 64. While running through a curved beam tube 70, the Kr+ ion beams 40 accelerated by the accelerator 20 are deflected substantially at right angles to the original traveling course when acted upon by a magnetic field created by the ion separation magnets 64, and discharged from the beam tube 70 in the form of separated beams 66. The radioactive Kr+ −85 beam 68 which constitutes the central portion of the separated beams 66 is conducted through a penetrating hole 76 bored at the center of a stopper 74 placed in an intermediate stopper chamber 72 provided at the end of the curved beam tube 70 and implanted in the stainless steel foil 48. The remaining nonradioactive krypton ion beams which constitute the outer portions of the separated beams 66 strike against the stopper 74 to be implanted therein. In this case, part of said nonradioactive ion beams is released in the form of nonradioactive krypton gas. The stopper 74 is formed of heat-resistant material such as graphite or liquid metal such as mercury or liquid sodium. The released nonradioactive krypton gas is drawn off by a third powerful exhaust unit 78, and discharged into the open air through a valve 80, if said gas has a lower specific radioactivity than permitted. The nonradioactive krypton gas taken out through the valve 80 has a sufficiently high purity to be recovered for reuse.

Figure 7:
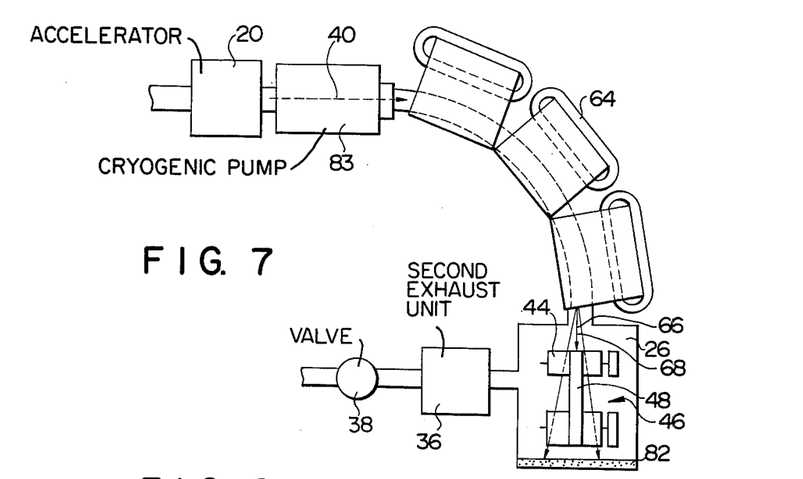
FIG. 7 illustrates the fifth embodiment in which the intermediate unit of FIG. 1 is provided with an ion separation magnet and the ion implantation unit of FIG. 1 is fitted with a stopper.
Figure 8:
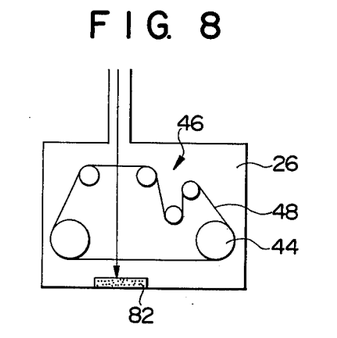
FIG. 8 is a side elevation of the ion implantation unit of FIG. 7.

FIG. 7 is another embodiment of the intermediate unit 24 which is also provided with a plurality of ion separation magnets 64. As in FIG. 6, krypton ion beams 40 run through the curved beam tube 70 and are deflected substantially at right angles to the original traveling course when acted upon by a magnetic field created by the ion separation magnets 64, and drawn off from the beam tube 70 in the form of separated beams 66 and introduced into the ion implantation unit 26. The radioactive Kr+ −85 ion beam 68 constituting the central portion of the separated beams 66 is implanted in a narrow stainless steel foil 48. The remaining nonradioactive krypton ion beams constituting the outer portions of the separated beams 66 pass, as shown in FIG. 8, between two rollers 44 to be ejected on a stopper 82 positioned at the bottom of the ion implantation unit 26. As apparent from FIG. 8, a foil-driving device 46 is of the endless type. Referential numeral 36 denotes a second exhaust unit for removing nonradioactive krypton gas evolved when the nonradioactive krypton ion beam strikes against the stopper 82. This second exhaust unit 36 should have a large capacity as in the embodiment of FIG. 6. Referential numeral 83 shows a cryogenic pump used as a first exhaust unit (designated as 28 in FIG. 1). The stopper 82 of FIG. 7 is made of the same material as the stopper 74 of FIG. 6.

For better understanding of the radioactive gas-implanting method and apparatus of this invention, detailed description is given of the main parts and operation factors of the subject apparatus together with numerical data.

Now let it be assumed that a nuclear fuel is disposed of at the rate of 0.7 ton/day; and the radioactive krypton gas Kr−85 is evolved at the rate of about 7% of the total krypton gas produced, that is, 8,000 Ci/day. Then the amount of said radioactive krypton gas Kr−85 is calculated as follows. The number of atoms of the evolved radioactive krypton gas Kr−85 is approximately $1.4 \times 10^{23}$ atoms/day, and the volume of said gas is about 5.2l/day at normal state. If all the radioactive Kr−85 gas is ionized and, accelerated, then the Kr+ −85 ion beam will have a value given below.

$$1.6 \times 10^{18} \text{ ions/s} \tag{1}$$

This ion beam corresponds to current of about 0.26 ampere. The total krypton gas has a volume 5.2/0.07, that is, 74l/day, corresponding to current of 3.7 amperes, and also to Kr+ ion beams of $2.3 \times 10^{19}$ ions/s.

If a saturated amount of the radioactive Kr+ −85 ion capable of being implanted in the stainless steel foil 48 is assumed to be $$1 \times 10^{18} \text{ ions/cm}^2 \tag{2}$$

Then it will be necessary to provide a stainless steel foil 48 measuring about 13.8 m² in order to implant the daily evolution of the radioactive Kr−85 gas whose per second volume is $1.6 \times 10^{18}$ ions/s as previously described. If the foil 48 is 10 microns thick and 2 cm wide, then it will be $6.9 \times 10^4$ cm long, with the volume of the foil 48, taken up on a 10 cm diameter reel has about 1860 turns, and the roll of said foil 48 has an outer diameter of about 14 cm. Namely, a foil in which the daily amount of radioactive Kr−85 gas has been implanted can be received in a cylindrical vessel measuring 14 cm in diameter and 2 cm in length. If all the krypton gas containing the radioactive component Kr−85 is to be implanted, then the required surface area of the foil 48 will be as large as 1/0.07 for about 14 times that of the preceding case. The foil 48 has a sufficiently small size to be easily kept in storage, whether all the krypton gas or the radioactive krypton gas Kr−85 alone is implanted in the foil 48.

Figure 9:
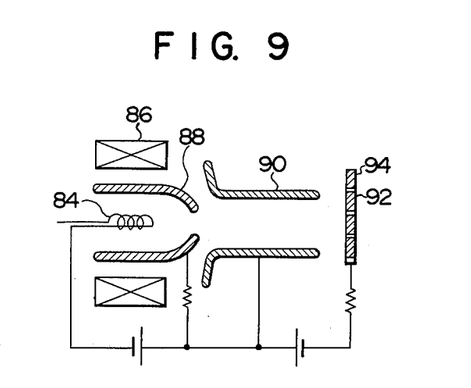
FIG. 9 presents an ion source.
Figure 10:
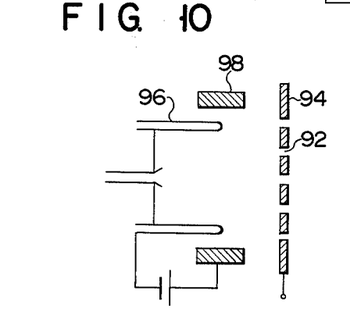
FIG. 10 is another embodiment of the ion source.
Figures 11, 12, 13, 14:
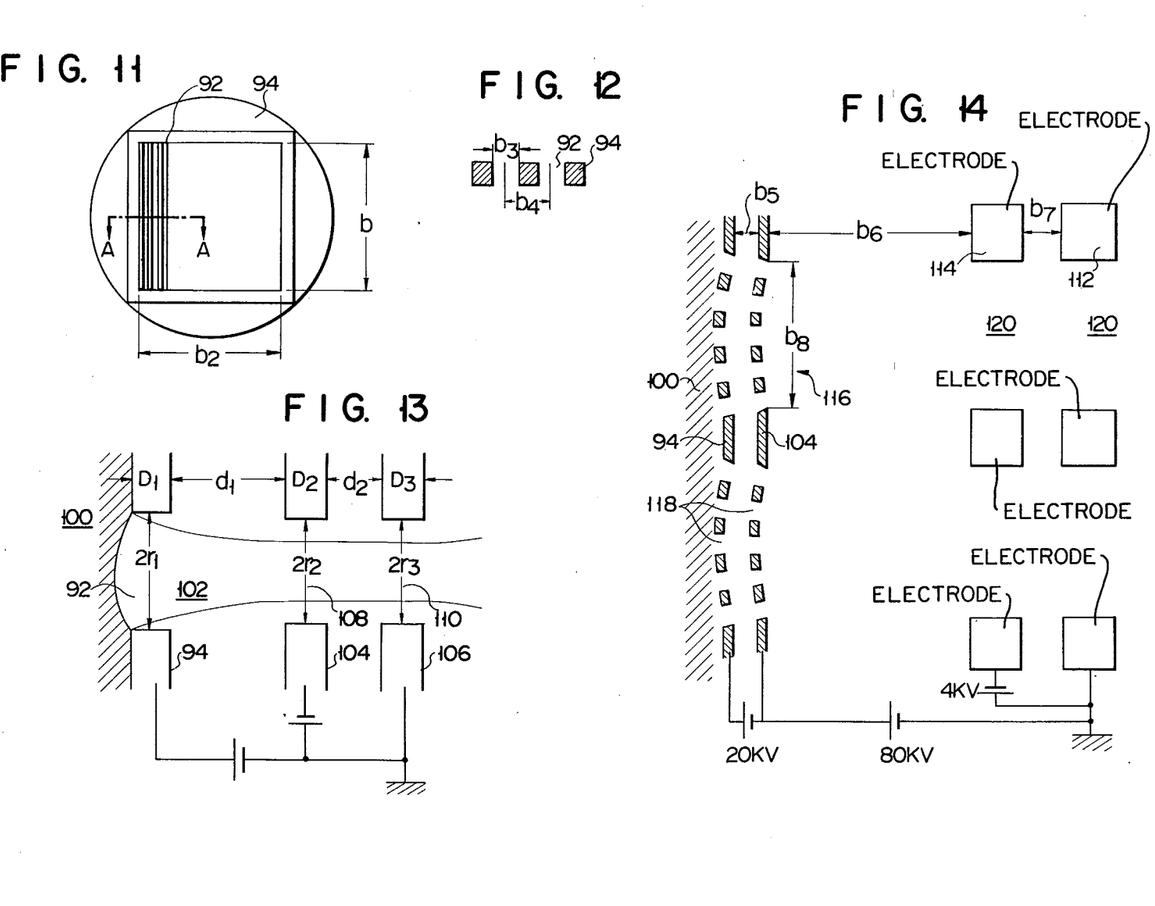
FIG. 11 is a front view of an ion extractor electrode.
FIG. 12 is a fractional cross sectional view of ion extracting parts formed in the ion extractor electrode.
FIG. 13 shows the construction of the first stage acceleration section of an accelerator.
FIG. 14 indicates the arrangement of the first and second stage acceleration section of the accelerator.

There will now be described the construction of the parts of the radioactive gas-implanting apparatus of FIG. 1 embodying this invention. FIGS. 9 and 10 show the construction of the main part of different ion sources 18. These ion sources 18 are provided alike with a multiaperture or multislit electrode bored with a large number of ion extracting parts. Such ion source 18 may be exemplified by the Duo PIGatron type developed by the Oak Ridge National Laboratory of the United States of America (abbreviated as ORNL) or the LBL type developed by Laurence Berkley Laboratory of U.S.A. The Duo PIGatron type ion source of FIG. 9 comprises a cathode 84, magnetic coil 86, intermediate electrode 88 facing said magnetic coil 86 and concurrently acting as a magnetic circuit, anode 90 and ion extractor electrode 94 bored with a large number of ion extracting slits 92. The cathode 84, intermediate electrode 88 and anode 90 jointly form Duoplasmatron which ionizes krypton gas supplied mainly from the reservoir 14 into a plasma. The intermediate electrode 88, anode 90 and ion extractor electrode 94 collectively constitute a Reflex Arc which highly ionizes the plasma and conducts the Kr+ ion included in the plasma to the accelerator 20 through the ion extracting slits 92. FIG. 10 shows the main part of the LBL type ion source 18. This LBL type ion source 18 comprises a hairpinshaped electrode 96 consisting of a large number of hairpinshaped filaments arranged in the cylindrical form, anode 98 and ion extractor electrode 94. Either of the above-mentioned two ion sources 18 provides continuously flowing ion beams with current density at the ion extracting slits 92 chosen to be 0.1 to 0.05 A/cm$^2$. In this case, the ion source 18 has a gas efficiency of about 50%. The ion extractor electrode 94 has a transmission coefficient of about 60%. Accordingly, the ion extractor electrode 94 has an area of 123 to 62 cm$^2$ which is arrived at by dividing the aforesaid ion current of 3.7 amperes by a product of 0.6 and (0.05 to 0.1) A/cm$^2$. With the embodiment of this invention, the ion extractor electrode 94 has, as shows in FIG. 11, a circular form 170 mm in diameter and an area of 100 cm$^2$, a value intermediate between the above-mentioned values 123 and 62 cm$^2$. The electrode 94 is provided with a large number of ion extracting slits 92 arranged within a circle in the square form measuring 100 which is selected between 123 and 62 cm$^2$) mm on each side. The ion extracting slits 92 have a width $b_3$ (FIG. 11) of 2 mm and a length of 100 mm and are spatially arranged with a pitch $b_4$ chosen to be 3.3 mm, said pitch $b_4$ denoting a distance between the central lines of every two adjacent spaces, as illustrated in FIG. 12 which is a fractional cross sectional view on line A—A of the ion extracting slits 92 of FIG. 11. In this case, there must be produced in the ion source 18 a circular plasma about 170 mm in diameter and almost uniformly distributed.

There will now be described by reference to FIG. 13 the construction and operation of the accelerator 20. The Kr+ ion has to be sufficiently accelerated to have a larger energy than 100 keV for implantation in, for example, the stainless steel foil 48 of FIG. 2. Said acceleration is carried out by the first stage and second stage acceleration sections of the accelerator 20. For higher acceleration, it is advised to provide a larger number of acceleration sections. FIG. 13 shows the shape of a Kr+ ion beam and the arrangement of ion extractor electrodes 94, where the Kr+ ion beam is drawn off from the plasma 100 produced in the ion source 18 through one of numerous ion extracting slits 92 and said Kr+ ion beam is subjected to the first stage acceleration. The ion extractor electrode 94 concurrently acts as an accelerating electrode for accelerating the Kr+ ion. When, therefore, the accelerator 20 is described, said ion extractor electrode 94 is hereinafter referred to as "an accelerating electrode."

As seen from FIG. 13, the Kr+ ion beam 102 drawn off through the ion extracting slit 92 of the accelerating electrode 94 passes through penetrating holes 108, 110 formed in a decelerating electrode 104 and a grounded electrode 106 respectively to the second stage accelerating section. Referential characters $r_1$, $r_2$, $r_3$ denote the radius of the ion extracting slit 92, and penetrating holes 108, 110 respectively. Referential characters $D_1$, $D_2$, $D_3$ show the thickness of the accelerating electrode 94, decelerating electrode 104 and grounded electrode 106 respectively. Referential character $d_1$ indicates a distance between the accelerating electrode 94 and decelerating electrode 104, and referential character $d_2$ a distance between the decelerating electrode 104 and grounded electrode 106. The accelerating electrode 94 and decelerating electrode 104 are impressed with positive voltage $V_1$ and negative voltage $V_2$ respectively relative to the ground. The optimum positions, constructions and measurements of the electrodes 94, 104, 106 have been experimentally determined. The following facts have been disclosed:
  (a) To minimize the expansion of the Kr+ ion beam 102, it is advised to choose S or $r_1/d_1$ to be 0.4 to 1 and $D_1/r_1$ to be 0.5 to 1.0;
  (b) If, in case $r_1$ changes, $d_1$ is so varied as to cause S or $r_1/d_1$ to have an optimum value, then the Kr+ ion beam 102 is saved from separation substantially fixing the current I of the Kr+ ion beam 102 passing through the ion extracting slit 92; and
  (c) Near the point at which S takes an optimum value, the current I of the Kr+ ion beam 102 is substantially proportional to 3/2th power of the positive accelerating voltage $V_1$, the angle $\omega$ through which the Kr+ ion beam 102 fully expands itself is proportional to $-\frac{1}{2}$th power of said positive accelerating voltage $V_1$, and the dielectric breakdown voltage across the accelerating voltage 94 and decelerating voltage 104 is substantially proportional to $\frac{1}{2}$th power of the distance $d_1$ between both electrodes 94, 104.

The above item (b) shows that the current of all the Kr+ ion beams can be increased, if $d_1$ and $r_1$ are made to have as small a value as possible with S allowed to have an optimum value as far as insulation permits and a large number of ion extracting slits 92 are provided. This is the reason why the multiaperture or multislit electrode is adapted to increase the current of the Kr+ ion beam.

The first stage acceleration section of FIG. 13 designed on the basis of the above-mentioned experimental results can produce a Kr+ ion beam having current of 1.7 to 3.5 milliamperes with 1.5° to 3° chosen as the angle $\omega$ through which the Kr+ ion beam fully expands itself starting with the ion extracting slit 92, on the assumption that $d_1$ is $2.8 \times 10^{-10} V_1^2$ cm; S is 0.4; $r_2/r_1$ is 1.0; $D_1/r_1$ is 0.5; $r_3/r_2$ is 1.0; $D_2/D_1$ is 1.2; $D_3/D_1$ is also 1.2; $d_2/r_2$ is 0.5; an absolute value of $V_2/V_1$ is 0.05; and voltage impressed across the decelerating electrode 94 and accelerating electrode 104 is 20 KV. For extracting of all the Kr+ ion beams having current of 3.7 amperes in total with an intermediate value between the aforesaid 1.7 milliamperes and 3.5 milliamperes taken to be 3 milliamperes, a required number of ion extracting slits 92 is calculated to be about 1230 from 3.7 amperes/3 milliamperes. Now let it be assumed that each ion extracting port 92 is a small circular orifice having a radius of about 1.1 mm, namely having an area of 4 mm$^2$. Then the current passing through said circular ion extracting port 92 may be expressed as follows:

$$3 \text{ milliamperes}/4 \text{ mm}^2 = 0.75 \text{ milliampere/mm}^2 \qquad (3)$$

As the result, $d_1$ is $r_1/0.4$, namely, about 2.5 mm. Since a required insulation distance for the aforesaid 20 kV is about 2 mm, insulation between the accelerating electrode 94 and decelerating electrode 104 is little likely to be broken. The above-mentioned experimental results obtained with the small circular ion extracting port 92 are also applicable to an ion extractor electrode provided with a large number of ion extracting slits. One of the slits shown in FIGS. 11 and 12 which is 2 mm wide and 100 mm long, namely, has an area of 200 mm² corresponds to 50 small circular ion extracting ports each having an area of 4 mm². 25 or 30 slits arranged, as shown in FIGS. 11 and 12, at the previously defined pitch of 3.3 mm correspond to 1230 or more small circular ion extracting ports.

FIG. 14 shows the arrangement of accelerating and decelerating electrodes used with an accelerator 20 comprising first and second acceleration sections. Referential numeral 94 denotes an accelerating electrode, referential numeral 104 a decelerating electrode, referential numeral 112 a first grounded electrode, and referential numeral 114 a second grounded electrode. The accelerating electrode 94 and decelerating electrode 104 jointly constituting the first stage acceleration section respectively comprises six ion extracting sections 116 having a width $b_8$ (only two ion extracting sections are indicated in FIG. 14). Each ion extracting section 116 is formed of a group of five ion extracting slits 118 bored in each of the electrodes 94, 104. Referential numeral 120 denotes penetrating holes bored in electrodes 112, 114 to conduct $Kr^+$ ion beams drawn off from the ion extracting sections 116 to the right side of FIG. 14. These penetrating holes 120 are provided for each ion extracting section 116. Referential character $b_5$ shows a distance between the accelerating electrode 94 and decelerating electrode 104, referential character $b_6$ a distance between the electrodes 104, 114, and referential character $b_7$ a distance between the electrodes 114, 112. The electrode 112 is grounded, and the electrodes 94, 104, 114 are impressed with voltage of 100 kV, 80 kV and −4 kV respectively relative to the ground. The electrodes 104, 114, 112 collectively constitute the second stage accelerating section. With the embodiment of FIG. 14, the distances $b_5$, $b_6$, $b_7$, $b_8$ are chosen to be 2.5 mm, 20 mm, 4 mm and 16 mm respectively. $Kr^+$ ion drawn off from a plasma 100 produced in the ion source undergoes the first stage acceleration between the accelerating and decelerating electrodes 94, 104 with a voltage of 20 kV, and the second stage acceleration between the electrodes 104, 112 with a voltage of 80 kV. The distance $b_6$ of 20 mm and the distance $b_8$ of 16 mm were determined in the following manner. The electrodes 94, 104, 114, 112 were supposed to be approximately plain electrodes. The above-mentioned distances $b_6$, $b_8$ were so chosen as to satisfy the following formula of current density J restricted by space charge.

$$J = \frac{4}{9} \cdot \frac{\epsilon_0}{b_0} (\frac{2q}{m_i})^{\frac{1}{2}} (\sqrt{V_I + V_{II}} + 2\sqrt{V_I})^2 (\sqrt{V_I + V_{II}} - \sqrt{V_I})$$

where:
$\epsilon_0$ = vacuum dielectric constant
$q$ = charge of $Kr^+$ ion
$m_i$ = mass of the $Kr^+$ ion
$V_I$ = voltage across the electrodes 94, 104
$V_{II}$ = voltage across the electrodes 104, 112
$b_0$ = distance between the electrodes used for second stage acceleration The distance $b_6$ between the electrodes 104, 114 is chosen to be smaller than the distance $b_0$. The reason is that the $Kr^+$ ion which enters the second stage acceleration section at the initial speed tends undesirably to be scattered in said second stage acceleration section. Now let it be assumed that the current density J is 0.75 mA/mm² according to the aforesaid formula (3), $V_I$ is 20 kV, and $V_I + V_{II}$ is 100 kV. Then the distance $b_0$ is calculated to be 22.3 mm. For the above reason, with the embodiment of FIG. 14, the distance $b_6$ is chosen to be 20 mm, a value smaller than 22.3 mm. Voltage across the electrodes 104, 114 is 80 kV + 4 kV = 84 kV. Since a required insulation distance for this voltage is about 18 mm, insulation between the electrodes 104, 114 is little likely to be broken. An optimum experimental value of 0.4 to 1 chosen for $r_1/d_1$ as described in connection with the first stage acceleration section is also applicable to the second stage acceleration section. The ratio of $b_8/2$ to $b_6$ is set at 0.4, and $b_8$ is chosen to be 18 mm relative to $b_6$ of 20 mm.

With an accelerator according to the embodiment of FIG. 14, the ion extractor electrode 94 and decelerating electrode 104 are arranged at an interval ($b_5$ in FIG. 14) of 2.5 mm. Six ion extracting sections each comprising a group of five ion extracting slits 2 mm wide and 100 mm long are provided for both electrodes 94, 104 so as to face each other. The first stage acceleration is carried out by impressing a voltage of 20 kV across both electrodes 94, 104. The second stage acceleration is effected by disposing the second grounded electrode 114 (bored with six penetrating holes 120 concentrically arranged with the respective ion extracting sections 116) at a space of 20 mm from the decelerating electrode 104 and setting the first grounded electrode 112 at a space of 4 mm from said second grounded electrode 114, and applying a voltage of 84 kV across the electrodes 104, 114 and 80 kV across the electrodes 104, 112.

There will now be described by reference to FIGS. 2 and 3 the operation of the first exhaust unit 28. When $Kr^+$ ion conducted from the accelerator 20 to the ion implantation chamber 26 through the accelerator extension 22 and intermediate unit 24 strikes against other gases remaining in the passage, then the $Kr^+$ ion ionizes said residual gases or carries out a charge exchange therewith. As the result, the $Kr^+$ ion beam which was initially made to have a uniformly distributed energy by the accelerator 20 is undesirably changed into the type having an ununiform energy distribution and an irregular traveling course. The first exhaust unit 28 is used to draw off the residual gases, and prevent the occurrence of the above-mentioned difficulties.

Now let $\sigma_c$ designate the charge exchange cross section of the $Kr^+$ ion, and $\sigma_i$ denote the ionization cross section of the $Kr^+$ ion when said ion ionizes the residual gases. The fraction $p$ of the $Kr^+$ ion which runs through the residual gases without taking the above-mentioned two processes may be expressed as follows:

$$p = \exp\{-(\sigma_c + \sigma_i)n_b \cdot l\}$$

where:
$n_b$ = density (atoms/cm³) of residual gases
$l$ = length of the passage through which the $Kr^+$ ion travels The embodiment of this invention shown in FIGS. 2 and 3 is so designed as to restrict the separation of the $Kr^+$ ion during transit to a smaller level than 1%. Assuming that in the above formula, $p$ is 0.99, $l$ is 500 cm, $\sigma_c$ is $1.5 \times 10^{-16}$ cm², and $\sigma_i$ is also $1.5 \times 10^{-16}$ cm², then the residual gas density $n_b$ is calculated to be 6.7 ×

$10^{10}$ atoms/cm$^3$. The pressure of the residual gases at normal temperature is $2 \times 10^{-6}$ Torr, as calculated by a simple method.

As previously mentioned, the volume of Kr gas evolved is 74l/day in a normal state. Considering that this value corresponds to 0.65 Torr·l/s, and the gas exchange efficiency of the ion source is about 50%, the first exhaust unit 28 should have a capacity of drawing off gases of 1.3 Torr·l/s at a larger rate than $6.5 \times 10^5$ l/s arrived at by dividing 1.3 Torr·l/s by $2 \times 10^{-6}$ Torr. A cryogenic pump is effectively adapted for use as an exhaust unit demanded to have such a large capacity. It is advised to use a cryogenic pump whose freezing surface can be maintained at 30° K. with respect to gases contained in the air such as $N_2$, $O_2$, Ar, $CO_2$ and $X_e$ and at 40° K. with respect to Kr gas. Where it is expected that gases such as $H_2$, Ne, He will be carried into the radioactive gas-implanting apparatus of this invention during its overhauling, then it is necessary jointly to apply at least two vacuum pumps such as an adsorption type cryogenic pump and a molecular pump. The radioactive krypton gas Kr-85 contained in the krypton gas condensed on the freezing surface of the cryogenic pump should advisably be conducted to the upstream side of the accelerator 20 through a gas-tight passage so as to be prevented from leakage. The cryogenic pump which cannot continuously return the krypton gas to the upstream side of the accelerator 20 due to its specific property is operated batchwise. However, the cryogenic pump can admit of the continuous return of the krypton gas to the upstream of the accelerator 20, if said pump is axially divided into a plurality of sections, the inlet and outlet of each section are provided with a valve, the krypton gas kept in the divided section in a frozen and condensed state is volatilized upon opening of the outlet valve and fed back to the krypton gas reservoir 14 (FIG. 1) by, for example, a bellows pump. When the freezing surface of each divided section is made ready for condensation of freshly introduced krypton gas, then a refrigerator is actuated to cool the freezing surface of said section. The outlet valve of said section is opened to volatilize the frozen and condensed krypton gas for return to the accelerator. The successive operation of the respective sections of the cryogenic pump enables the krypton gas to be continuously recovered.

Figure 15:
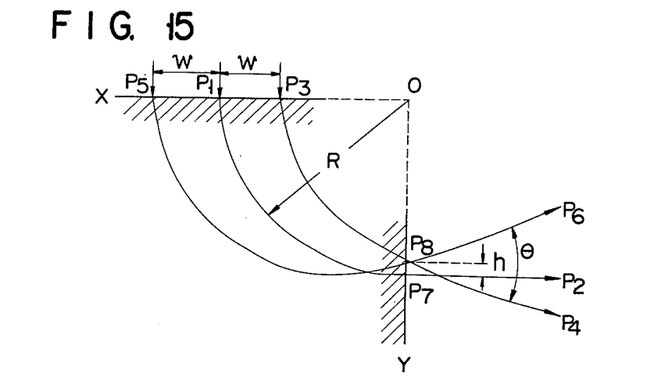
FIG. 15 illustrates the manner in which ion beams of the same mass number are deflected by a magnetic field.

There will now be described by reference to FIGS. 6 and 7 the operation of an ion separation unit installed in the intermediate unit 24 of FIG. 1. In FIGS. 6 and 7, the ion separation unit is formed of an ion separation magnet 64. A magnetic field acting perpendicular to the drawing surface is created in a quadrant defined by the lines OX, OY of FIG. 15. In FIG. 15, a parallel ion beam consisting of, for example, radioactive krypton ion beams Kr$^+$-85 having the same mass number and having a width of 2$w$ is ejected on a magnetic field at right angles to the line OX. The central portion of the beam is deflected 90° from point P1 to P7. The beam is removed from the magnetic field in the direction of P2 substantially at right angles to the line OY. The right edge portion of the radioactive krypton ion beam Kr$^+$-85 runs along a P3-P8 course to a point P4, while the left edge portion of said beam Kr$^+$-85 travels along a P5-P8 course to a point P6. Namely, the radioactive krypton ion beam Kr$^+$-85 deflected by the magnetic field has a spatial spread $h$ on the line OY, and expands itself to the right at a separation angle $\theta$. With R taken to denote the radius of an orbit of the radioactive krypton ion beam Kr$^+$-85 running from the point P1 to the point P7, then the spatial spread $h$ and separation angle $\theta$ may be expressed by the following formulas respectively, if $w$ is far smaller than R.

$$h = R - \sqrt{R^2 - w^2} \simeq \frac{w^2}{2R}$$

$$\phi = 2 \sin^{-1} \frac{w}{R}$$

Figure 16:
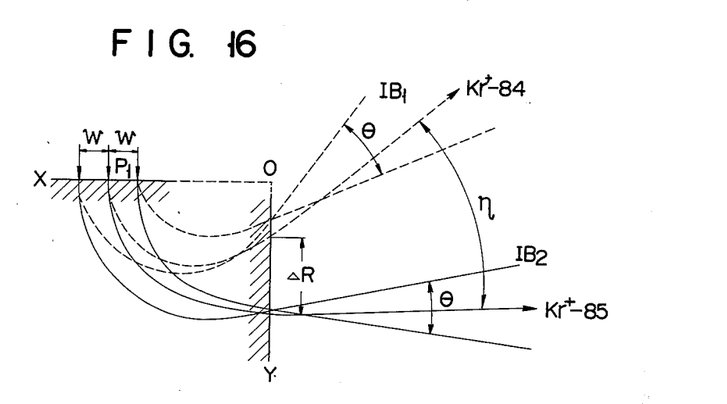
FIG. 16 presents the manner in which a mixture of ion beams $Kr^+-84$ and $Kr^+-85$ is separated into said two components by a magnetic field.

In FIG. 16, a mixture consisting of two forms of krypton ion beams Kr$^+$-84 and Kr$^+$-85 of different mass numbers and having a width of 2$w$ is ejected on a magnetic field at right angles to the line OX as in FIG. 15. In this case, said mixed krypton ion beams are curved as illustrated, and after leaving the magnetic field, are separated into the respective components Kr$^+$-84 ion beam IB$_1$ and Kr$^+$-85 ion beam IB$_2$ each having the $h$ and $\theta$ described in FIG. 15. The IB$_1$ and IB$_2$ have a spread $\Delta$R on the line OY and are separated to the right of the drawing with an angle $\eta$ defined therebetween. With B taken to denote the magnetic flux density; $m$ and $m'$ the different mass numbers of the IB$_1$ and IB$_2$; $q$ the electric charge of the ions; E the energy of the IB$_1$ and IB$_2$; R and R' the radii of the curbed orbits of the IB$_1$ and IB$_2$; $\Delta$R a difference between the radii R' and R; and C the velocity of light in vacuum, then the following formulas result:

$$\Delta R = \frac{C \sqrt{2E}}{B_q} (\sqrt{m'} - \sqrt{m})$$

$$\eta = \sin^{-1} \frac{\Delta R}{R}$$

For complete separation of the IB$_1$ and IB$_2$, $\Delta$R should be larger than the spreads $h$ of the IB$_1$ and IB$_2$, and $\eta$ should be larger than the separation angles $\theta$ of the IB$_1$ and IB$_2$.

Though it may be considered advisable to let R and R' have a large value in order to elevate the capacity of the ion separation magnet 64 (FIGS. 6 and 7), yet the resultant radioactive gas-implanting apparatus will become undesirably bulky. Therefore, it is necessary properly to limit the values of R and R'. With R chosen to be 2.0 m; E 100 keV; B 0.21 Wb/m$^2$; and 2$w$ 5 cm, then $h$ is calculated to be 0.016 cm; $\Delta$R 1.2 cm; $\theta$ 1.42°; and $\eta$ 0.34°. These calculated values enable the IB$_1$ and IB$_2$ to be completely separated on the line OY constituting the edge portion of magnetic field. Since, however, $\theta$ has a larger value than $\eta$, the IB$_1$ and IB$_2$ overlap each other at a point removed for a distance L from the OY line. With $l_0$ taken to denote the width of the IB$_1$ and IB$_2$ at said overlapping point, the following formulas result.

$$L = \Delta R / (2 \sin \frac{\phi}{2} - \tan \eta)$$

$$\frac{l_0}{2} = L \tan \frac{\phi}{2}$$

With the calculated values of $\Delta$R, $\theta$ and $\eta$ substituted in the above formulas, L is calculated to be 63.2 cm and $l_0$ 1.57 cm. Therefore, in the range following within L of 63.2 cm, the IB$_1$ and IB$_2$ can be fully separated. Where calculation was made of another krypton ion beam Kr$^+$-86, this beam was also found to be separated from the radioactive Kr+-85. With the radioactive gas-implanting apparatus of this invention, therefore, a metal foil about 1.57 cm wide is set up at a point falling short of 63.2 cm as measured from the edge portion of a magnetic field for implantation of the radioactive ion beam Kr+-85. The remaining nonradioactive krypton ions are made to travel toward the downstream side of the metal foil to strike against the stopper for implantation therein or gasification.

The foregoing description refers to the case where the ion separation magnet 64 separated radioactive krypton ion Kr+-85 and other nonradioactive krypton ions from each other which has only a monovalent charge. However, multivalent krypton ions are considered to be present in an exhaust from a nuclear fuel-reprocessing plant. Where the main part of the krypton ion consists of two forms of electric charge, it may be advised to use an ion separation magnet capable of dividing said ion into two channels. However, such type of ion separation magnet actually presents difficulties on separating the radioactive krypton ion Kr+-85, in case the main part of an ion has different forms of charge, or the degree of charge exchange occurring in accelerated krypton ions can not be overlooked. In this case, all krypton ions are implanted in a foil without being separated. The number of krypton ions implanted in the foil is about 14 times larger than when only the radioactive krypton ion Kr+-85 is implanted. Therefore, it is necessary to use a foil having a large surface area in order to implant an increased amount of krypton ions and remove heat built up in the foil due to said implantation.

There will now be described the process of implanting krypton ions in the foil. The krypton ions implanted in the foil are precipitated on a proper nucleus to produce gas bubbles. For example, a dislocation line, grain boundary, cluster of point defects caused by ion irradiation, dislocation loop and fine precipitate act as a nucleus. The pressure P of the krypton gas bubble keeps a balance with the surface tension $\gamma$ of a matrix produced within a metal (for example, stainless steel) forming a foil, maintaining the following relationship:

$$P = 2\gamma/a$$

The character $a$ in the above formula denotes the radius of the krypton gas bubble. If the krypton gas is supposed to be an ideal gas, then the number $n$ of atoms contained in each of the krypton gas bubbles may be expressed by the following formula:

$$n = \frac{PV}{kT} = \frac{4}{3} \cdot \frac{\pi a^3 P}{kT} = \frac{8}{3} \cdot \frac{\pi a^2 \gamma}{kT}$$

where:
$V$ = volume of one krypton gas bubble
$T$ = absolute temperature of the krypton gas
$k$ = Boltzmann's constant With $\rho$ taken to denote the density of the krypton gas bubbles, the total number $N_o$ of the krypton gas atoms contained in a foil having a volume arrived at by multiplying a unit area by a thickness $R_o$ may be expressed as follows:

$$N_o = R_o \rho\, n$$

Thus, $N_o$ corresponds to the area density of the krypton gas atoms. Assuming that the krypton gas bubbles are spaced from each other at a distance twice the diameter of the gas bubble, then the unit area density $\rho$ of the krypton gas bubbles will be $(4a)^{-3}$ and $N_o$ will be indicated by the following formula:

$$N_o = R_o \pi \gamma / 24 kTa$$

Figure 18:
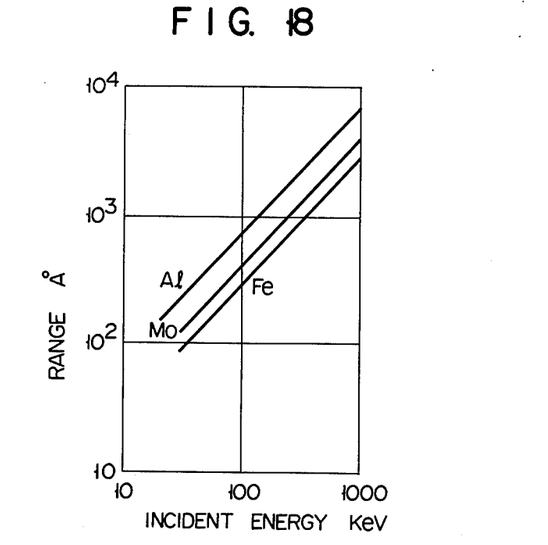
FIG. 18 shows the relationship between the energy of the $Kr^+$ ion when implanted in aluminium, molybdenum and iron used as a base material and the range of the $Kr^+$ ion within said metals.

The above formula shows that the krypton gas atoms have a higher density, as the krypton gas bubbles are more decreased in sized. Assuming that the thickness $R_o$ is substantially equal to the range of the krypton ions in the foil, the larger range or $R_o$ increases $N_o$. Though it is necessary to use a large powerful accelerator to increase $N_o$, yet a certain limitation is imposed on the size of the accelerator. FIG. 18 shows the relationship of the incident energy and range of the krypton ion when implanted in a foil of aluminium, iron or molybdenum. Assuming that the diameter of the krypton gas bubble is about 100 Å, then the range of the krypton ion should be longer than several hundred Å units. FIG. 18 shows that where implanted in a foil of aluminium, the krypton ion should have an incident energy of about 50 keV, and, when implanted in a foil of molybdenum, should have an incident energy of about 100 keV.

Figure 19:
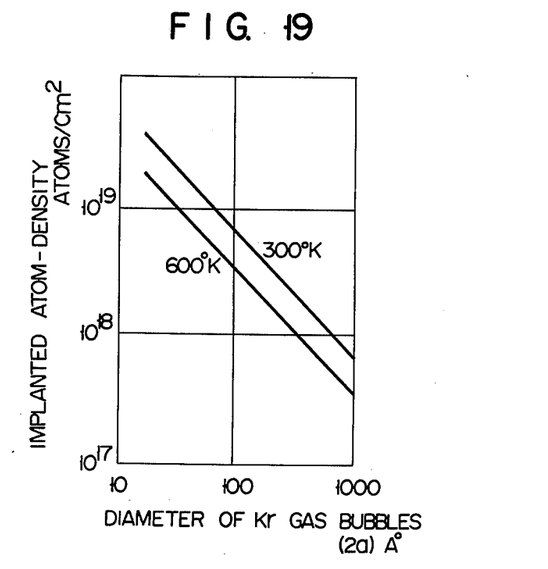
FIG. 19 sets forth the relationship between the areal density of implanted atoms at 300° K. and 600° K. and the diameter of gas bubbles produced in the base material.

FIG. 19 sets forth the relationship between the unit area density N of the atoms of krypton when the krypton ions are implanted and the radius $a$ of the krypton gas bubbles produced. FIG. 19 indicates data obtained by calculated based on the aforesaid formula of $N_o$ representing the total number of krypton gas atoms, with the surface tension $\gamma$ of the previously mentioned matrix taken to be 1,500 dyne/cm and $R_o$ to be $10^{-5}$ cm. With $a$ taken to be 50 Å and consequently $2a$ 100 Å and krypton gas temperature 300° K., then the unit area density N of krypton atoms is indicated as $6 \times 10^{18}$ atoms/cm². Previously the formula (2) assumed $1 \times 10^{18}$ ions/cm² as value corresponding to the unit area density N of krypton atoms. The value of the formula (2) may be regarded as more reasonable than the value $6 \times 10^{18}$ atoms/cm².

Figure 20:
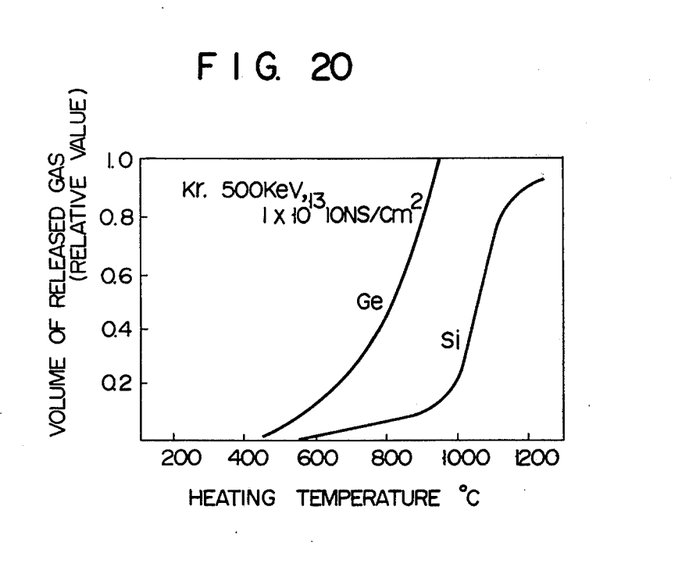
FIG. 20 indicates the relationship between the temperature of silicon and germanium used as a base material in which the $Kr^+$ ion of 500 KeV is implanted and an amount of the $Kr^+$ ion gas released from said base materials.

For safe keeping, the radioactive krypton gas Kr-85 should be implanted in a foil under stable condition. To the end, the bubbles of said radioactive Kr-85 gas should preferably be prevented from migration. This migration is affected by the temperature of a foil, stress applied thereto and the size of the Kr-85 gas bubbles. For example, where the foil is heated to such high temperature as approaches the melting point, then the greater part of the Kr-85 gas implanted in the foil is given off. Where the Kr-85 gas is implanted at high concentration even when the foil is kept at low temperature, then said gas tends to be released. FIG. 20 shows Matzke's experimental data obtained where krypton ions having an energy of 500 keV were implanted in a foil of silicon and germanium respectively at a unit area density of $1 \times 10^{13}$ ions/cm². The data indicates the relationship between the heating temperature applied to the silicon and germanium foils and the volume of the krypton gas released therefrom, where the volume of the crypton gas is indicated by relative value. The data shows that to prevent the evolution of the krypton gas from the silicon and germanium foils, the foils should advisably be kept at half the respective melting points Tm of 1430° C. and 958° C., namely, lower levels than about 720° and about 480° C. Where a stainless steel foil is used as in the embodiment of this invention, it is advised to keep the foil at temperature of 700° to 750° C. equal to half the melting point (1400° to 1500° C.) of said foil.

Where all krypton ions accelerated to about 100 keV (corresponding to 3.7 amperes) are implanted in a foil, the foil is heated to high temperature with power consumption of 370 kW. Therefore, cooling means should be provided to keep the foil at a lower level than half the melting point Tm, thereby preventing the krypton gas from being released from said foil. Application of stainless steel as a foil is for the reason that it has a relatively high melting point and appreciably great mechanical strength.

There will now be described temperature rise in the foil and countermeasures therefor. Reference is made to the case where only the radioactive $Kr^+$-85 ion separated by the ion separation magnet 64 (FIGS. 6 and 7) is implanted in a stainless steel foil about 10 microns thick and the other krypton ions are ejected on the stopper 74 or 82 (FIGS. 6 and 7).

Figure 17:
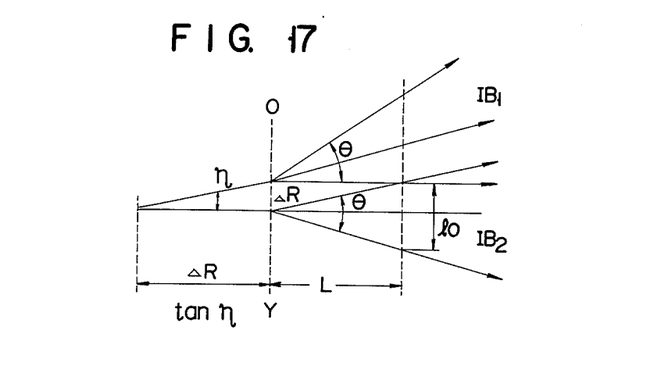
FIG. 17 is a fractional enlarged view of the manner in which two forms of ion beam having closely resembling mass numbers are separated.

The stainless steel foil is placed within a distance L from the line OY constituting the edge portion of a magnetic field as described in connection with FIG. 17. In this case, the width $l_0$ of all the krypton ion beams is calculated to be 1.57 cm as in FIG. 17. With a gap between the cores of the ion separation magnet 64 taken to be 10 cm, the cross sectional area of the krypton ion beam passing through said magnet 64 is calculated to be 1.57 × 10 cm². Therefore, the incident energy density $q_T$ of the radioactive krypton ion $Kr^+$-85 implanted in the stainless steel foil placed within a distance L from the line OY may be calculated as follows:

$$q_T = 100 \text{ KV} \times 0.26\text{A}/(1.57 \text{ cm} \times 10 \text{ cm}) = 1.66 \text{ kW/cm}^2$$

where:

100 kV = accelerating voltage
0.26 A = current value corresponding to the radioactive $Kr^+$-85 ion beam having the value of the previously mentioned formula (1)

Where another krypton ion beam, for example, $Kr^+$-86, separated from the radioactive $Kr^+$-85 ion beam is ejected on the stopper, a maximum energy is applied to the stopper. $q'_T$ denoting the incident energy density of the $Kr^+$-86 ion beam is calculated as follows:

$$q'_T = 100 \text{ kV} \times 3.7 \text{ A} \times 0.52/(1.57 \text{ cm} \times 10 \text{ cm}) \approx 12.3 \text{ kW/cm}^2$$

where:

3.7 A = electic current corresponding to all the krypton ion beams
0.52 = percentage evolution of the Kr-86 gas relative to all the krypton gases.

Figure 21:
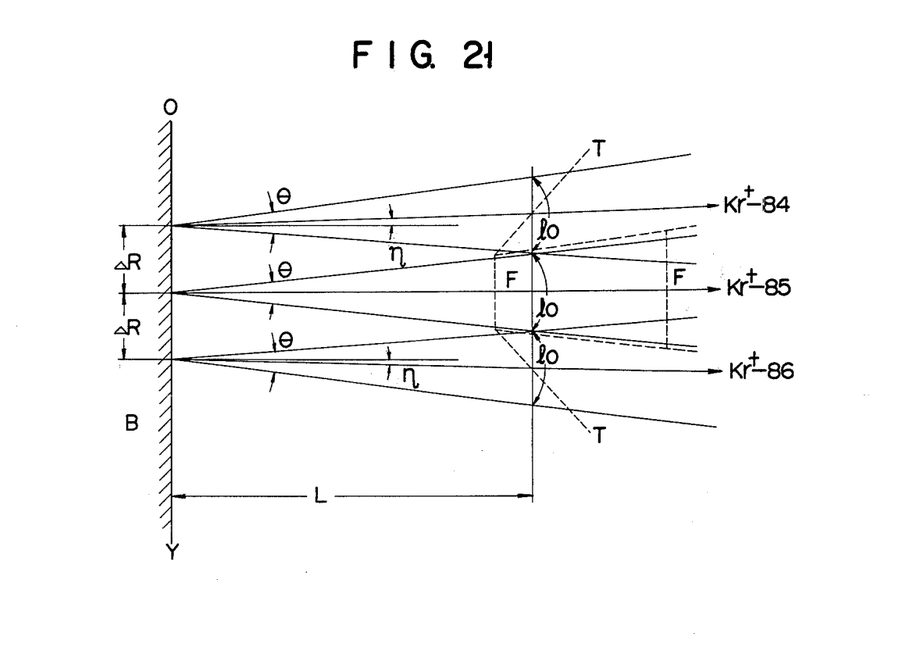
FIG. 21 is an enlarged view showing the overlapping conditions of three ion beams of $Kr^+-84$, $Kr^+-85$ and $Kr^+-86$ forming a mixture when separated from each other by a magnetic field.

FIG. 21 shows the case where the $Kr^+$-84 and $Kr^+$-86 ion beams are separated from the radioactive $Kr^+$-85 ion beam. Those of the referential characters indicated in FIG. 21 which are also given in FIGS. 15 to 17 denote the same items. Since $q'_T$ is much larger than $q_T$, it will be effective to release heat from the foil, if the radioactive $Kr^+$-85 ion beam is implanted in the foil disposed at a point F falling short of a distance L from the line OY and eject the remaining krypton ion beams $Kr^+$-84 and $Kr^+$-86 on the corresponding pointed big stoppers T, T of large heat capacity which gradually expand from the point F to the right side of FIG. 21. Though, for simplification of the construction of an ion implantation unit, it may be considered possible to eject all the krypton ions on the foil without separating them, yet this arrangement is accompanied with the disadvantage that the amount of all the krypton ions implanted in, for example, a stainless steel foil becomes about 14 times larger than when only the radioactive krypton ion is implanted.

There will now be described the case where the radioactive krypton ion $Kr^+$-85 is implanted in a foil 10 microns thick which is placed at the point F of FIG. 21. In this case, the following assumption is made $\Delta T°$ K. = a temperature rise in the foil when moved at a speed of $v$ cm/s at right angles to the surface of the drawing
Specific heat of the foil = 0.5 J/g° K.
Specific density of the foil = 7.8 g/cm³
Width of the foil = 1.57 cm
Thickness of the foil = 10 microns or $10 \times 10^{-4}$ cm
Incident energy density $q_T$ of implanted $Kr^+$-85 ion beam = 1.66 kW/cm², consequently $1.66 \times 10^3$ W/cm²
Implantation area of $Kr^+$-85 ion beam = 1.57 × 10 cm²

Then, a temperature rise in the foil may be expressed as follows:

$$0.5 \times 7.8 \times 1.57 \times (10 \times 10^{-4}) \times v\Delta T = 1.66 \times 10^3 \times (1.57 \times 10)$$

Thus, the following formula results:

$$v\cdot\Delta T = 4.25 \times 10^6 \text{ cm/s.° K.}$$

where $v$ denotes the traveling speed ahead of the foil.

As previously mentioned, the increased temperature $\Delta T$ of the stainless steel foil resulting from implantation of the radioactive $Kr^+$-85 ion beam should be kept at a lower level than about 700° C. corresponding to half the melting point of said stainless steel foil to prevent the evolution of the radioactive Kr-85 gas from the foil. With 700° C. substituted in $\Delta T$ given in the above formula, the traveling speed $v$ of the foil is calculated to be about 60 m/s. At this time, the areal speed of the foil is calculated to be 1.57 cm × (60 × 100 cm/s) or 0.945 × $10^4$ cm²/s. With the saturated amount of the radioactive $Kr^+$-85 ion implanted in the foil taken to be $1 \times 10^{18}$ ions/cm² as shown in the aforesaid formula (2), and the flow rate of the radioactive $Kr^+$-85 ion to be $1.6 \times 10^{18}$ ions/s as given in the previously described formula (1), then per second ejection of the radioactive $Kr^+$-85 ion enables only $1.6 \times 10^{18}$ ions to be implanted in the foil, though $0.945 \times 10^4 \times (1 \times 10^{18})$ ions can be implanted with respect to the per second traveling area of $0.945 \times 10^{14}$ cm²/s. For saturated implantation of the radioactive $Kr^+$-85 ion in the foil, therefore, it is necessary repeatedly to eject said $Kr^+$-85 ion on the foil $0.945 \times 10^4 \times (1 \times 10^{18})/1.6 \times 10^{18}$ times, namely 5900 times, thus, it is desired to provide suitable means for such repeated ejection. Further, the foil should be positively cooled smoothly to carry out the repeated implantation of the radioactive $Kr^+$-85 ion in the foil. To this end, it is advised to cool the foil by utilizing some of the rollers over which the foil is stretched, or causing the foil to travel through liquid metal.

There will now be described a temperature difference between both surface of the stainless steel foil. Where the incident energy density $q_T$ of the radioactive $Kr^+$-85 ion is taken to be 1.66 kW/cm², a temperature difference between both surfaces of a stainless steel foil 10 microns thick is calculated to be about 10° C., because stainless steel has a thermal conductivity of 0.16 J/cm° Cs. A temperature difference between both surfaces of a stainless steel foil 20 microns thick indicates about 20° C. Such temperature difference as 10° or 20° C. is extremely smaller than about 700° C. taken as a temperature rise in the stainless steel foil resulting from ejection of the radioactive $Kr^+$-85 ion beam. Therefore, the foil may be regarded as being uniformly heated. A stainless steel foil 20 microns thick can be moved at a speed of 30 m/s, admitting of the easy manufacture of a foil-driving mechanism. Consumption of a 20-micron thick stainless steel foil, both surfaces of which are irradiated by the radioactive $Kr^+$-85 ion beam can be held as same amount as a 10-micron thick stainless steel foil, only one surface of which is used for implantation.

Once, the radioactive $Kr^+$-85 ion is implanted in a foil, any other nonradioactive krypton ions can be easily disposed of at a fully separated location. For example, the remaining nonradioactive krypton ions may be ejected on a water-cooled stopper or on the surface of liquid metal in which a cooling heat exchanger is received.

There will now be described an exhaust unit for discharging krypton gases released from a foil after once implanted therein. The second exhaust unit 36 of FIGS. 1, 2, 3, 5, 6 and 7 and the third exhaust unit 78 of FIG. 6 are used for this purpose. Where the radioactive $Kr^+$-85 ion is separated from other nonradioactive krypton ions by the ion-separation unit 64 (FIGS. 6 and 7), said other nonradioactive krypton ions are ejected on the stopper 74, 82 and are mostly converted into krypton gases. Therefore, the second and third exhaust units 36, 78 should have substantially the same capacity as the first exhaust unit 28 designed to draw off other gases than krypton gases still remaining in the accelerator 20 and ion implantation unit 26, in order to discharge the nonradioactive krypton gases evolved from the stoppers 74, 82. The third exhaust unit 78 connected to the intermediate stopper chamber 72 of FIG. 6 and the second exhaust unit 36 connected to the ion implantation unit 26 of FIG. 7 are used to draw off krypton gases released from the stoppers 74, 82 respectively. These second and third exhaust units 36, 78 may be formed of a cryogenic pump. Where, however, krypton gases evolved from the stoppers 74, 82 have an extremely low specific radioactivity, it is possible to apply an oil diffusion pump of large caliber. Regardless of the type of pump used, the krypton gases evolved from the stoppers 74, 82 can be discharged into the open air through the valve 80 (FIG. 6) or the valve 38 (FIG. 7). Obviously, it is necessary always to watch for the possible radioactivity of krypton gases taken out at the exhaust port.

Where all krypton ions are implanted in the foil without being separated by the ion separation unit 64, only small amounts of krypton gases are released from the foil, making it possible to apply a small capacity exhaust unit. Namely, the second exhaust unit 36 of FIGS. 1, 2, 3, 5, 6 and 7 is allowed to have a small capacity. Referring to FIG. 6, the second exhaust unit 36 connected to the ion implantation unit 26 is used to draw off the radioactive Kr-85 gas released from the foil 48 and is allowed to have a small capacity. In this case, however, the radioactive Kr-85 gas which is given off from the foil 48 must be returned to the reservoir (FIG. 1) through an airtight passage (not shown).

As apparent from the foregoing description, the method and apparatus of this invention can safely and easily detain radioactive gas like Kr-85 gas by implantation in a metal foil made of, for example, stainless steel, offering great convenience in the disposal of radioactive gas.

What we claim is:

1. A method for permanent disposal of radioactive waste gases which comprises the steps of ionizing the waste radioactive gas to produce positive ions; accelerating said ionized radioactive gas to have high energy; and implanting said accelerated radioactive ion in a base material for permanent disposal.

2. An apparatus for permanent disposal of radioactive waste gases which comprises a reservoir for holding the waste radioactive gas; an ion source for ionizing the radioactive gas delivered from the reservoir to produce positive ions; an accelerator for accelerating the radioactive ions formed in the ion source into high energy; and an ion implantation unit connected to the accelerator through an extension thereof to implant the radioactive high energy ion beam for permanent ion implantation disposal in a base material received in said implantation unit.

3. The apparatus for permanent disposal of waste gases according to claim 2, which further comprises a first exhaust unit connected to the accelerator extension to draw off gases remaining in the accelerator through the extension, and a second exhaust unit connected to the ion implantation unit to discharge gases released from the base material.

4. The apparatus for permanent disposal of radioactive waste gases according to claim 3, which further comprises a recovery unit for separating the radioactive gas from the gases drawn off by the first exhaust unit and returning the recovered radioactive gas to the reservoir.

5. The apparatus for permanent disposal of radioactive waste gases according to claim 2 wherein the base material is a band-shaped foil formed of metal such as stainless steel, aluminium and copper, and which further comprises a foil-driving mechanism for moving the foil relative to the radioactive ion beam.

6. The apparatus for permanent disposal of radioactive gases according to claim 5, wherein the foil-driving mechanism is designed for the endless travel of the foil.

7. The apparatus for permanent disposal of radioactive waste gases according to claim 5, wherein there is provided ahead of the accelerator extension an intermediate unit provided with an electromagnetic deflection unit for determining the manner in which the radioactive accelerated ion beam is implanted in the base material received in the ion implantation unit.

8. The apparatus for permanent disposal of radioactive waste gases according to claim 7, wherein the electromagnetic deflection unit is a magnetic deflection unit which creates an A.C. magnetic field acting perpendicular to the running course of the radioactive ion beam, thereby oscillating the radioactive ion beam in zigzags across the base material at right angles to the traveling direction of the base material.

9. The apparatus for permanent disposal of radioactive waste gases according to claim 7, wherein the electromagnetic deflection unit is an electrode for producing an A.C. electric field acting perpendicular to the running course of the radioactive ion beam, thereby oscillating the radioactive ion beam in zigzags across the base material at right angles to the traveling direction of the base material.

10. The apparatus for permanent disposal of radioactive waste gases according to claim 7, wherein the electromagnetic deflection unit is an ion separation magnet for separating an ion beam into a plurality of components having different mass numbers.

11. The apparatus for permanent disposal of radioactive waste gases according to claim 10, wherein the intermediate unit comprises an intermediate stopper chamber containing a stopper irradiated by nonradioactive ion beams separated from the radioactive ion beam by the ion separation magnet and a third exhaust unit for evacuating the intermediate stopper chamber.

12. The apparatus for permanent disposal of radioactive waste gases according to claim 11, wherein the stopper is formed of liquid metal such as mercury and liquid sodium.

13. The apparatus for permanent disposal of radioactive waste gases according to claim 11, wherein the stopper is prepared from heat-resistant material such as graphite, pyrocarbon, magnesia, calcia and zirconia.

14. The apparatus for permanent disposal of radioactive waste gases according to claim 10, wherein the ion implantation unit contains the stopper irradiated by nonradioactive ion beams separated from the radioactive ion beam by the ion separation magnet.

15. The apparatus for permanent disposal of radioactive waste gases according to claim 14, wherein the stopper is formed of liquid metal such as mercury and liquid sodium.

16. The apparatus for permanent disposal of radioactive waste gases according to claim 14, wherein the stopper is prepared from heat-resistant material such as graphite, pyrocarbon, magnesia, calcia and zirconia.

17. The apparatus for permanent disposal of radioactive waste gases according to claim 2, which further comprises a gas detector fitted to the ion implantation unit to indicate the degree of ion-implantation in the base material and to generate an output signal for controlling the operation of the accelerator according to said implanted amount.

* * * * *